US007572132B2

(12) United States Patent
Johnson et al.

(10) Patent No.: US 7,572,132 B2
(45) Date of Patent: Aug. 11, 2009

(54) METHODS AND APPARATUS FOR FLEXIBLE EXTENSION OF ELECTRICAL CONDUCTORS BEYOND THE EDGES OF A SUBSTRATE

(75) Inventors: Morgan T. Johnson, Portland, OR (US); Peter H. Decher, Lake Oswego, OR (US)

(73) Assignee: Advanced Inquiry Systems, Inc., Hillsboro, OR (US)

( * ) Notice: Subject to any disclaimer, the term of this patent is extended or adjusted under 35 U.S.C. 154(b) by 183 days.

(21) Appl. No.: 11/879,736

(22) Filed: Jul. 17, 2007

(65) Prior Publication Data
US 2008/0248663 A1  Oct. 9, 2008

Related U.S. Application Data

(60) Provisional application No. 60/831,965, filed on Jul. 18, 2006.

(51) Int. Cl.
*H01R 13/62* (2006.01)
(52) U.S. Cl. .................................... 439/152
(58) Field of Classification Search ............. 439/152; 257/778; 710/310
See application file for complete search history.

(56) References Cited

U.S. PATENT DOCUMENTS

2007/0023921 A1* 2/2007 Zingher et al. ............. 257/778
2007/0043894 A1* 2/2007 Zingher et al. ............. 710/310

* cited by examiner

*Primary Examiner*—Jean F Duverne
(74) *Attorney, Agent, or Firm*—Raymond J. Werner (57) ABSTRACT

A flexible extension wafer translator includes a wafer translator portion, one or more flexible connectors extending outwardly therefrom, and a connector tab coupled to the distal end of each outwardly extending flexible connector. The flexible connectors may take any suitable form, including but not limited to, draped and pleated.

12 Claims, 8 Drawing Sheets

METHODS AND APPARATUS FOR FLEXIBLE EXTENSION OF ELECTRICAL CONDUCTORS BEYOND THE EDGES OF A SUBSTRATE

CROSS-REFERENCE TO RELATED APPLICATIONS

This non-provisional application claims the benefit of Provisional Application 60/831,965, filed 18 Jul. 2006, and entitled "Methods And Apparatus For Flexible Extension Of Electrical Conductors Beyond The Edges Of A Substrate", the entirety of which is hereby incorporated by reference.

FIELD OF THE INVENTION

The present invention relates generally to semiconductor test equipment, and more particularly relates to methods and apparatus for routing electrical conductors to and from integrated circuits, microelectromechanical devices (MEMs), or similar structures in a test environment.

BACKGROUND

Advances in semiconductor manufacturing technology have resulted in, among other things, reducing the cost of sophisticated electronics to the extent that integrated circuits have become ubiquitous in the modern environment.

As is well-known, integrated circuits are typically manufactured in batches, and these batches usually contain a plurality of semiconductor wafers within and upon which integrated circuits are formed through a variety of semiconductor manufacturing steps, including, for example, depositing, masking, patterning, implanting, etching, and so on.

Completed wafers are tested to determine which die, or integrated circuits, on the wafer are capable of operating according to predetermined specifications. In this way, integrated circuits that cannot perform as desired are not packaged, or otherwise incorporated into finished products.

It is common to manufacture integrated circuits on roughly circular semiconductor substrates, or wafers. Further, it is common to form such integrated circuits so that conductive regions disposed on, or close to, the uppermost layers of the integrated circuits are available to act as terminals for connection to various electrical elements disposed in, or on, the lower layers of those integrated circuits. In testing, these conductive regions are commonly contacted with a probe card.

The maintenance of probe tip accuracy, good signal integrity, and overall dimensional accuracy severely strains even the best of these highly developed fabrication methods because of the multiple component and assembly error budget entries.

What is needed are lower-cost, less-complex apparatus and methods to increase test efficiency.

SUMMARY OF THE INVENTION

Briefly, a flexible extension wafer translator includes a wafer translator portion, one or more flexible connectors extending outwardly therefrom, and a connector tab coupled to the distal end of each outwardly extending flexible connector. The flexible connectors may take any suitable form, including but not limited to, draped and pleated.

DETAILED DESCRIPTION

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Terminology

Reference herein to "circuit boards", unless otherwise noted, is intended to include any type of substrate upon which circuits may be placed. For example, such substrates may be rigid or flexible, ceramic, flex, epoxy, FR4, or any other suitable material.

Pad refers to a metallized region of the surface of an integrated circuit, which is used to form a physical connection terminal for communicating signals to and/or from the integrated circuit.

The expression "wafer translator" refers to an apparatus facilitating the connection of pads (sometimes referred to as terminals, I/O pads, contact pads, bond pads, bonding pads, chip pads, test pads, or similar formulations) of unsingulated integrated circuits, to other electrical components. It will be appreciated that "I/O pads" is a general term, and that the present invention is not limited with regard to whether a particular pad of an integrated circuit is part of an input, output, or input/output circuit. A wafer translator is typically disposed between a wafer and other electrical components, and/or electrical connection pathways. The wafer translator is typically removably attached to the wafer (alternatively the wafer is removably attached to the translator). The wafer translator includes a substrate having two major surfaces, each surface having terminals disposed thereon, and electrical pathways disposed through the substrate to provide for electrical continuity between at least one terminal on a first surface and at least one terminal on a second surface. The wafer-side of the wafer translator has a pattern of terminals that matches the layout of at least a portion of the pads of the integrated circuits on the wafer. The wafer translator, when disposed between a wafer and other electrical components such as an inquiry system interface, makes electrical contact with one or more pads of a plurality of integrated circuits on the wafer, providing an electrical pathway therethrough to the other electrical components. The wafer translator is a structure that is used to achieve electrical connection between one or more electrical terminals that have been fabricated at a first scale, or dimension, and a corresponding set of electrical terminals that have been fabricated at a second scale, or dimension. The wafer translator provides an electrical bridge between the smallest features in one technology (e.g., pins of a probe card) and the largest features in another technology (e.g., bonding pads of an integrated circuit). For convenience, wafer translator is referred to simply as translator where there is no ambiguity as to its intended meaning. In some embodiments a flexible wafer translator offers compliance to the surface of a wafer mounted on a rigid support, while in other embodiments, a wafer offers compliance to a rigid wafer translator. The surface of the translator that is configured to face the wafer in operation is referred to as the wafer-side of the translator. The surface of the translator that is configured to face away from the wafer is referred to as the inquiry-side of the translator. An alternative expression for inquiry-side is tester-side.

The expression "edge extended wafer translator" refers to an embodiment of a translator in which electrical pathways disposed in and/or on the translator lead from terminals, which in use contact the wafer under test, to electrical terminals disposed outside of a circumferential edge of a wafer aligned for connection with, or attached to the edge extended translator.

The expression "translated wafer" refers to a wafer that has a wafer translator attached thereto, wherein a predetermined portion of, or all of, the contact pads of the integrated circuits on the wafer are in electrical contact with corresponding electrical connection means disposed on the wafer side of the translator. Typically, the wafer translator is removably attached to the wafer. Removable attachment may be achieved, for example, by means of vacuum, or pressure differential, attachment.

The terms chip, integrated circuit, semiconductor device, and microelectronic device are sometimes used interchangeably in this field. The present invention relates to the manufacture and test of chips, integrated circuits, semiconductor devices and microelectronic devices as these terms are commonly understood in the field.

Figure 1:
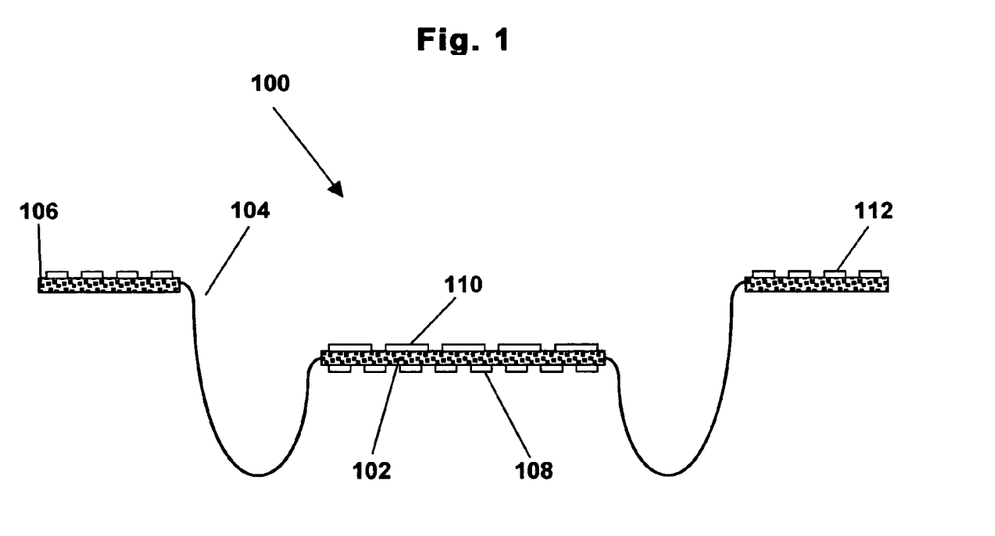
FIG. 1 is a cross-sectional representation of an illustrative flexible extension wafer translator.

FIG. 1 is a schematic cross-sectional representation of an embodiment of a flexible extension wafer translator 100, that includes a wafer translator portion 102, draped flexible connectors 104 extending outwardly from wafer translator portion 102 and connector tabs 106 disposed at the distal ends of the draped flexible connectors 104. A plurality of electrically contact structures 108 disposed on the wafer-side of wafer translator portion 102 are available to electrically contact one or more pads on the integrated circuits of a wafer. Wire paths disposed within wafer translator portion 102 convey signals between contact structures 108 and a plurality of electrically conductive pads 110 disposed on the inquiry-side of wafer translator portion 102. Additionally, wire pathways disposed within wafer translator portion 102 and within or on flexible connectors 104 convey signals from pads 108 to a plurality of electrically conductive pads 112 disposed on the uppermost surface, or inquiry-side, of connector tabs 106.

Figure 2:
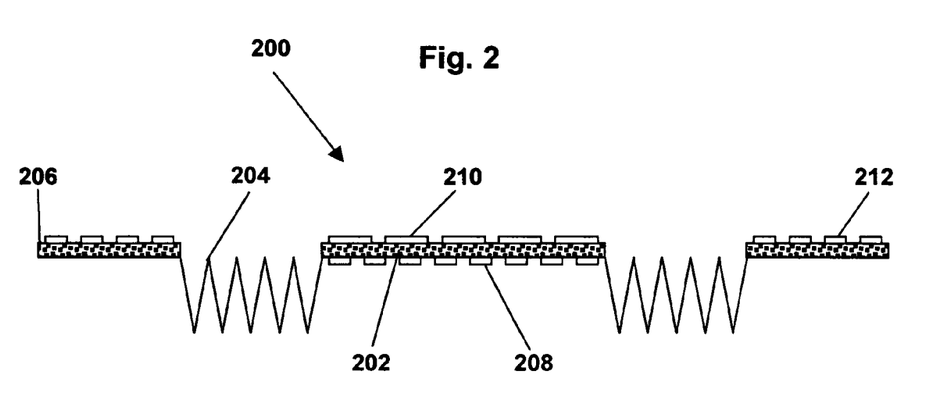
FIG. 2 is a cross-sectional representation of alternative flexible extension translator in which the flexible connectors are pleated in an accordion style fold.

FIG. 2 is a schematic cross-sectional representation of an embodiment of a flexible extension wafer translator 200, in which electrical signals may be conveyed between a wafer translator portion 202 and connector tabs 206 by pleated (i.e., accordion-style fold) flexible connectors 204. Flexible connectors 204 may be any suitable combination of materials for carrying one or more electrically conductive pathways on, or in, an insulating material. A plurality of electrically contact structures 208 disposed on the wafer-side of wafer translator portion 202 are available to electrically contact a wafer. Wire paths disposed within wafer translator portion 202 convey signals between contact structures 208 and a plurality of electrically conductive contact terminals 210 disposed on the inquiry-side of wafer translator portion 202. Additionally, wire pathways disposed within wafer translator portion 202 and flexible connectors 204 convey signals from contact structures 208 to a plurality of electrically conductive contact terminals 212 disposed on the uppermost surface, or inquiry-side, of connector tabs 206.

Figure 3:
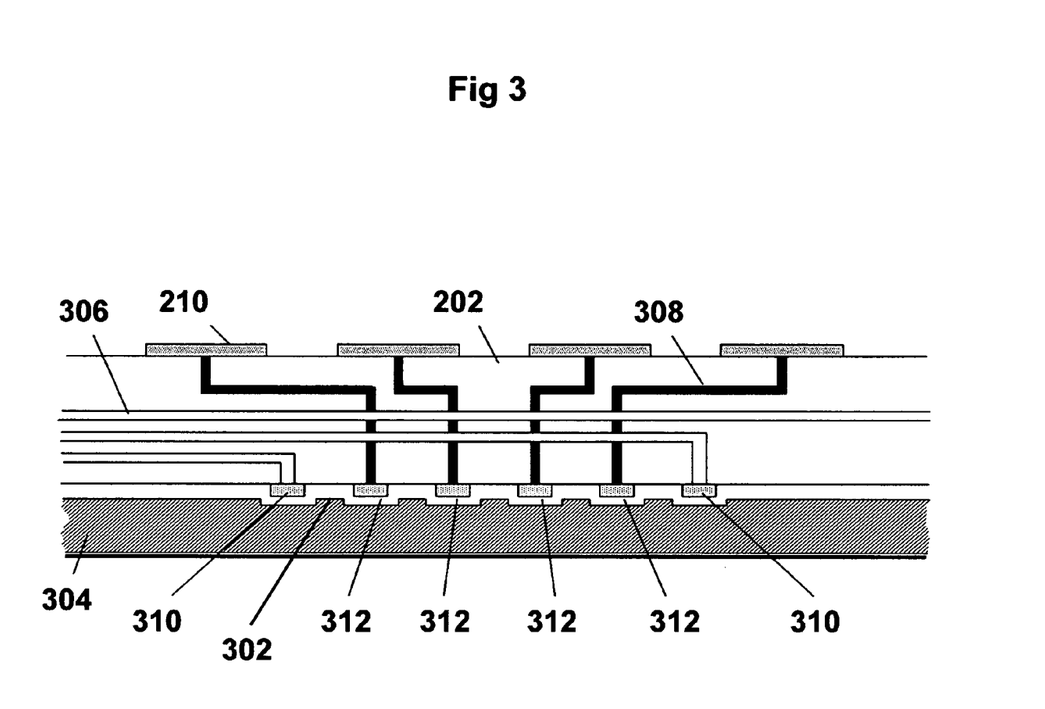
FIG. 3 is a close-up schematic cross-sectional representation of a single die on a wafer in contact with the electrically conductive pads and wire paths disposed on and within an FE translator.
Figure 7:
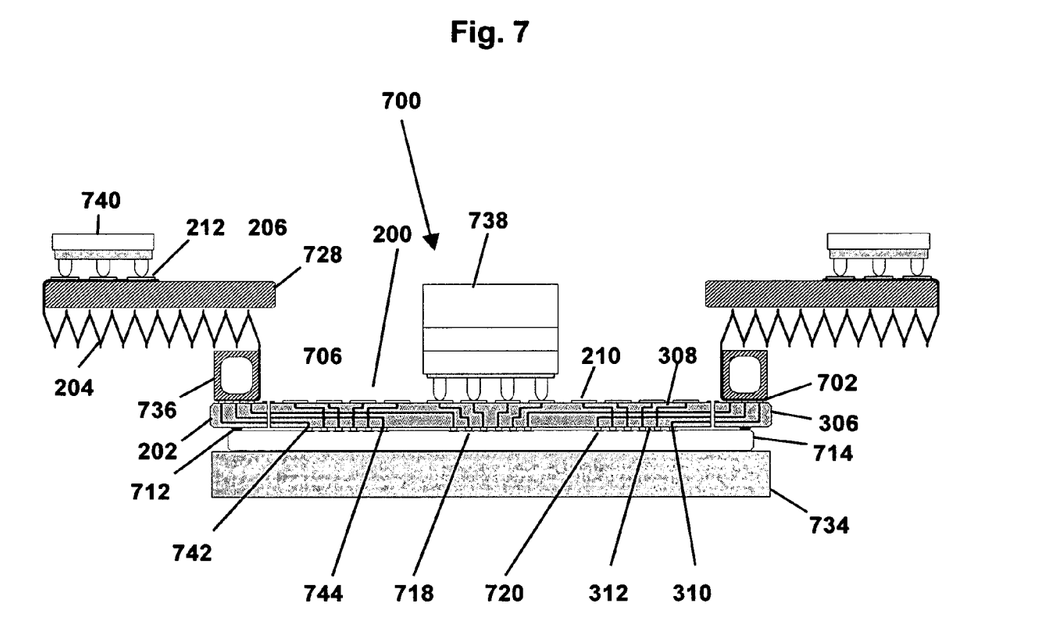
FIG. 7 is a cross-sectional representation of a flexible extension wafer translator mounted for use within a bimodal wafer test assembly.
Figure 8:
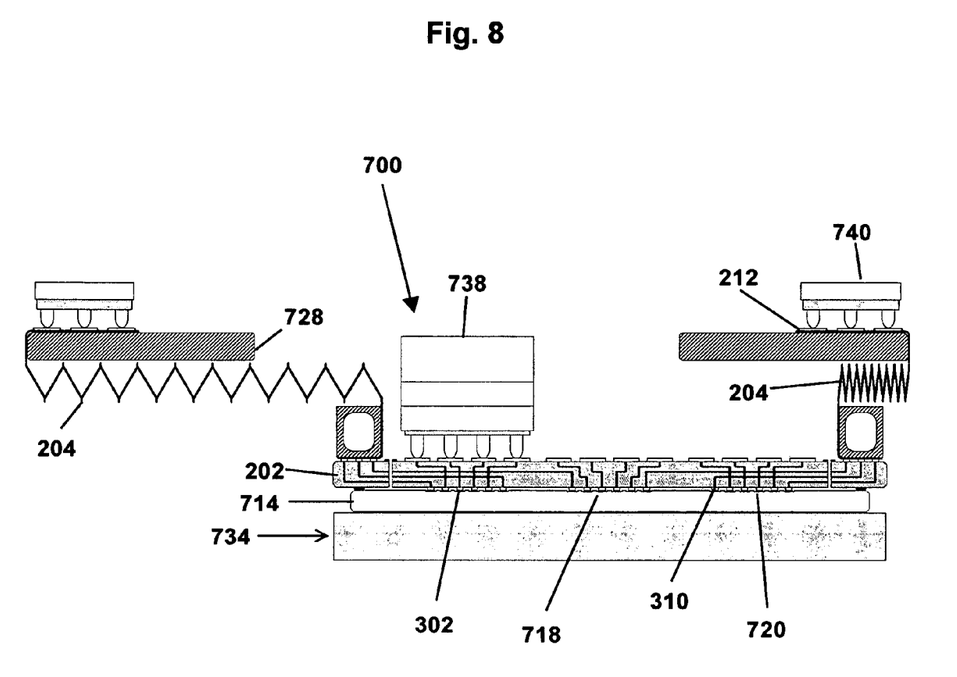
FIG. 8 is a schematic cross-sectional representation of a flexible extension wafer translator in an illustrative test assembly configured for concurrent BIST and structural testing of integrated circuits.

FIG. 3 is a schematic cross-sectional representation of wafer translator 202 in contact with an integrated circuit 302, disposed within a wafer 304. In this embodiment, two distinct sets of wire paths 306 and 308, contact two distinct sets of electrically conductive pads 310 and 312, so that they may be contacted simultaneously, contemporaneously or asynchronously. Wire paths 306 connect to electrically conductive pads 310, and may be led off of the wafer to DFT/BIST pads located beyond the outer edge(s) of wafer translator 202 (as shown in FIGS. 7 and 8). Wire paths 308 connect electrically conductive pads 312 to wafer sort pads 210 disposed on the upper surface of translator 202.

Figure 4:
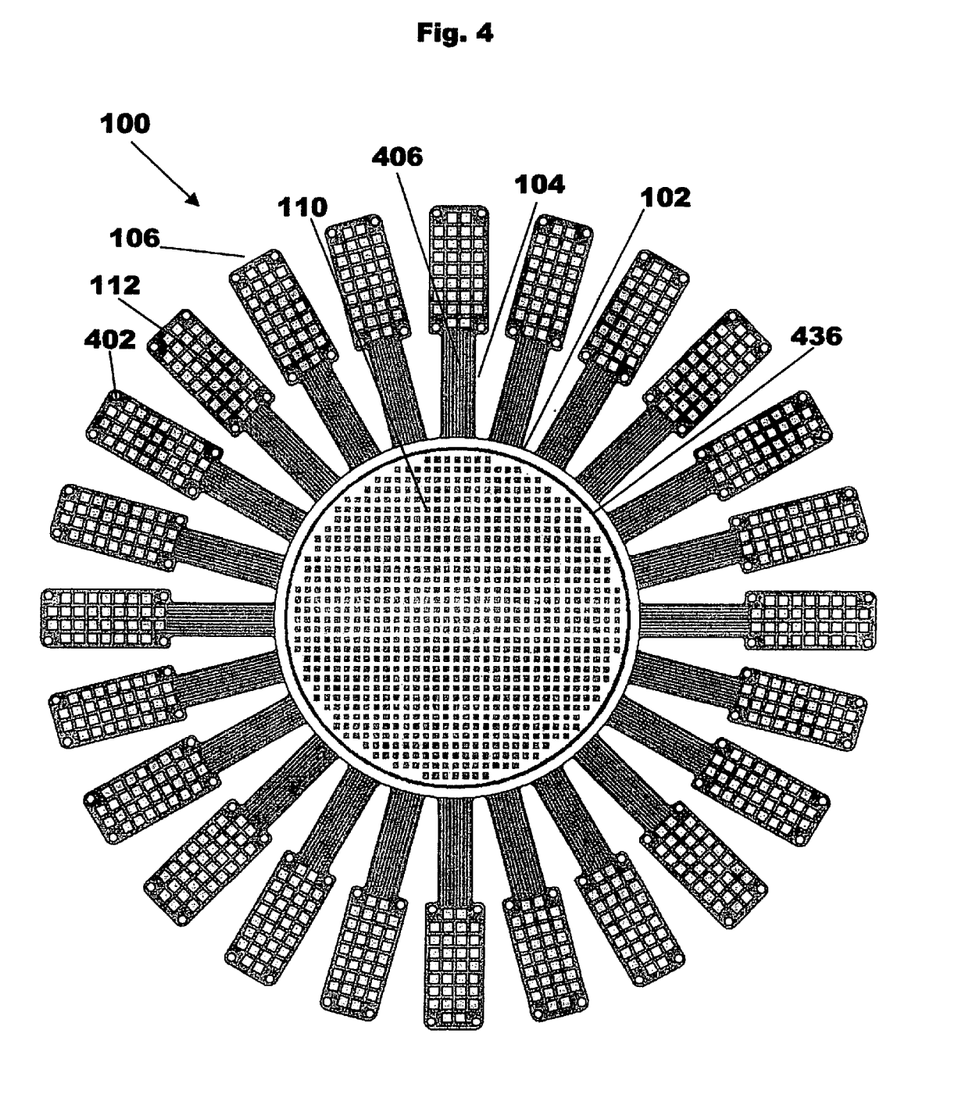
FIG. 4 is a top view of an embodiment of a flexible extension wafer translator.

FIG. 4 is a top view of an embodiment of a flexible extension wafer translator 100, including a wafer translator portion 102 with a circumference matching that of a wafer under test, flexible connectors 104, printed with wire paths 406, connector tabs 106, and guide frame 436. Perforations 402 in connector tabs 106 provide for gross mechanical alignment and affixing to a mounting fixture (as shown in FIGS. 7 and 8). A plurality of contact terminals 112 are disposed on connector tabs 106. Wire paths 406 convey electrical signals to and from contact terminals 112 and pads disposed on the wafer-side of wafer translator portion 102 (as pictured in FIG. 1). Wafer sort pads 110 are disposed on the upper surface of translator 102. In some embodiments, wire paths are printed on flexible substrate. In alternative embodiments, wire paths may be otherwise formed using coaxial cable, ribbon cable or other flexible conductive devices, materials and substrates.

Figure 5:
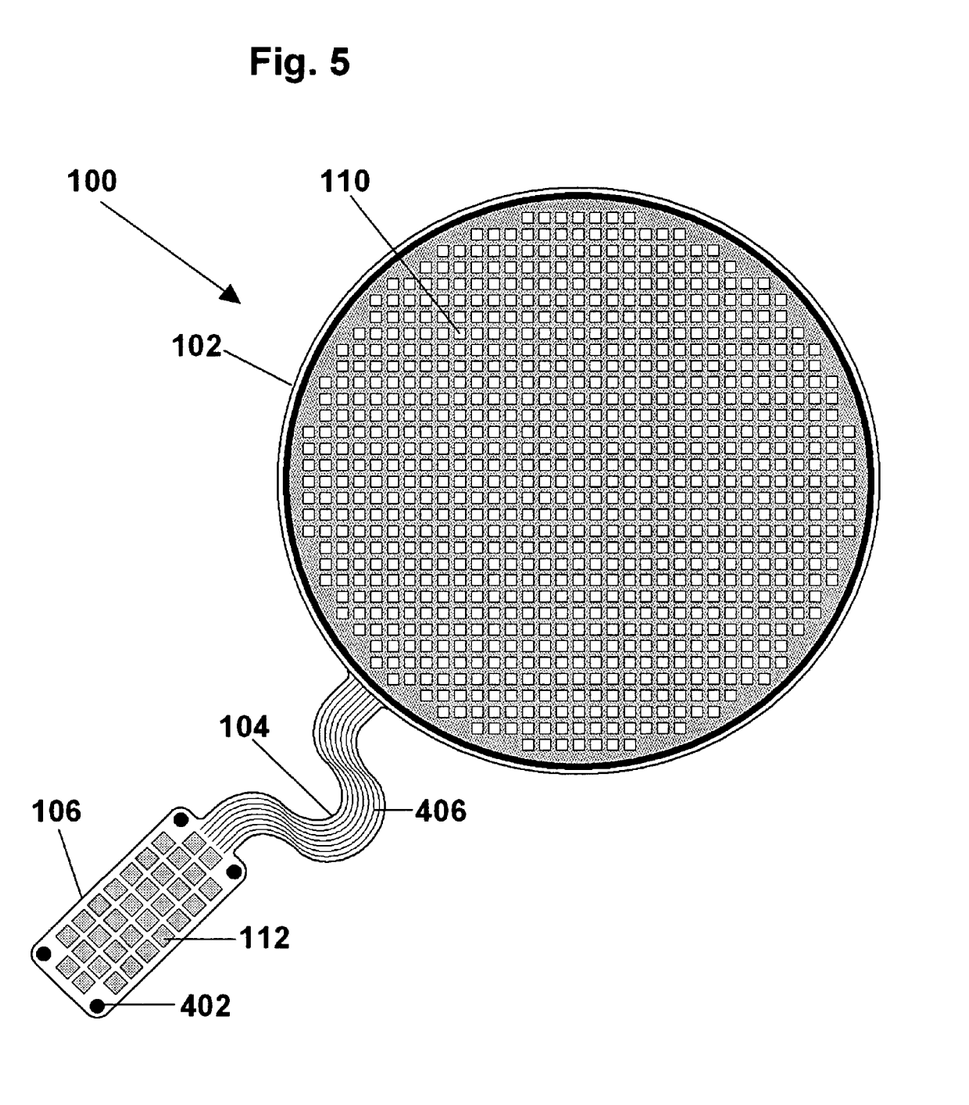
FIG. 5 is a close-in three-quarter view of a section of a flexible extension wafer translator with draped flexible conductors.

FIG. 5 is a view of a section of flexible extension wafer translator 100, detailing a single draped flexible connector 104, wafer translator 102 and connector tab 106. Perforations 402 in connector tab 106 allow for alignment and attachment to a mounting fixture (as shown in FIGS. 7 and 8). A plurality of contact terminals 112 are disposed on the surface of connector tab 106. In this embodiment, wire paths 406 printed on flexible connector 104 convey signals between contact terminals 112 and contact structures disposed on the wafer-side of wafer translator portion 102 (as shown in FIG. 1). A plurality of electrically conductive contact terminals 110 are disposed on the surface of wafer translator portion 102, and electrically connected to a plurality of contact structures on the wafer-side of wafer translator portion 102 by wire paths disposed within wafer translator portion 102 (as shown in FIG. 3).

Figure 6:
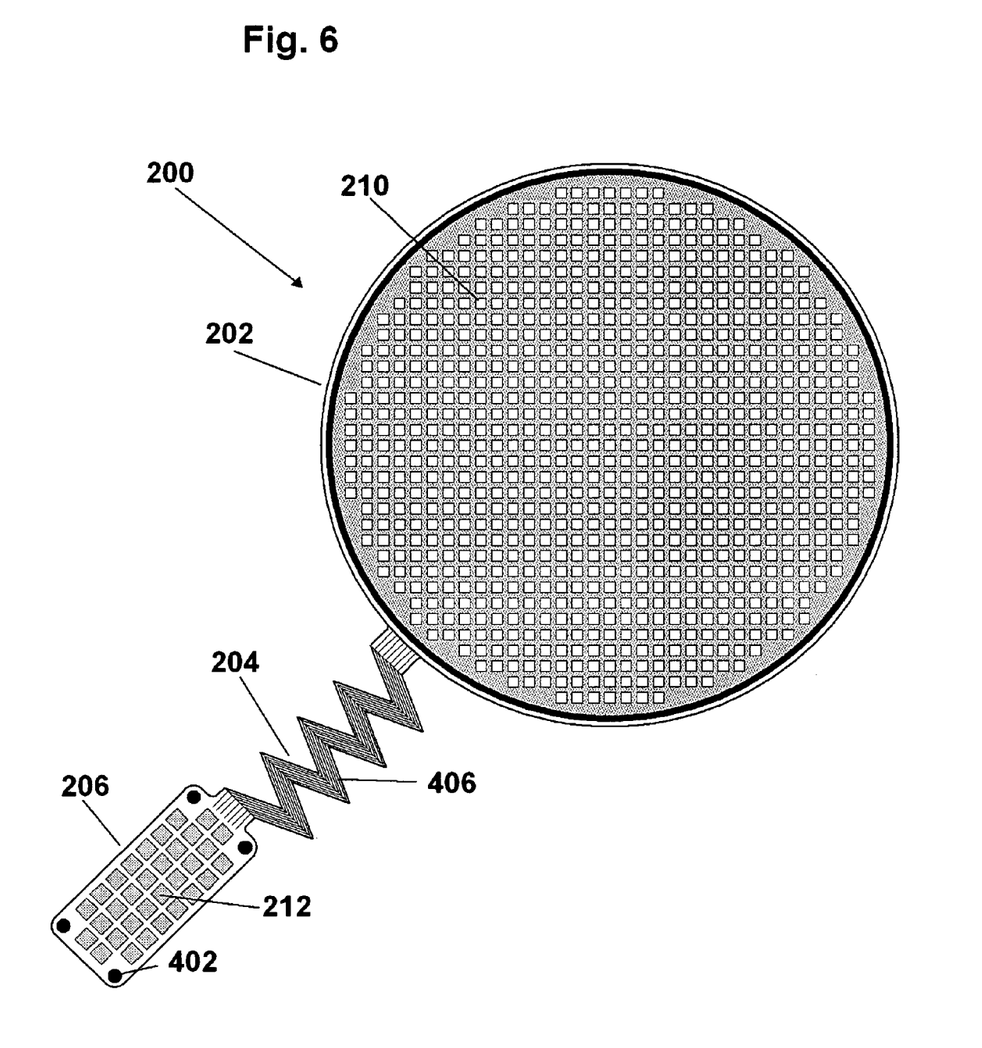
FIG. 6 is a close-in three-quarter view of a section of a flexible extension wafer translator with pleated flexible conductors.

FIG. 6 is a view of a section of flexible extension wafer translator 200, detailing a single pleated flexible connector 204, wafer translator portion 202 and connector tab 206. Perforations 402 in connector tab 206 allow for alignment and attachment to a mounting fixture (as pictured in FIGS. 7 and 8). A plurality of contact terminals 212 are disposed on the uppermost surface, or inquiry-side of connector tab 206. In this embodiment, wire paths 406 printed on pleated flexible connector 204 convey signals between contact terminals 212 and contact structures disposed on the wafer-side of wafer translator portion 202 (as shown in FIG. 1). A plurality of electrically conductive contact terminals 210 are disposed on the inquiry-side of wafer translator portion 202, and electrically connected to a plurality of contact structures on the wafer-side of wafer translator portion 202 by wire paths disposed within wafer translator portion 202 (as shown in FIG. 3). It is noted that contact pads 210 and contact pads 212 taken together provide for concurrently testing integrated circuits on a wafer with different tests, such as for example, BIST and structural testing.

FIG. 7 is a schematic cross-sectional representation of flexible extension wafer translator 200 mounted for use within a bimodal full wafer test assembly 700, including wafer translator portion 202, flexible connectors 204 and connector tabs 206. Connector tabs 206 are affixed to mounting fixture 728. Wafer translator portion 202 and wafer 714 may be removably attached by any suitable means, including, for example, vacuum or pressure differential, attachment. In one illustrative embodiment, a pliable gasket 712 and vacuum evacuation path 706 are used to create a vacuum, or pressure differential that holds wafer translator portion 202 and wafer 714, together. Wafer 714 is mounted on wafer chuck 734. The removable attachment of wafer translator portion 202 and wafer 714 brings into contact a plurality of electrically conductive contact structures 310 and 312, disposed on the wafer-side of wafer translator portion 202, and a plurality of electrically conductive pads 742 and 744 disposed on, or in, the uppermost surface of wafer 714. Electrically conductive pads 742 and 744 are mutually disposed on wafer 714 in a pattern suitable for future physical separation into discrete integrated circuits, or die 718, 720. In this embodiment, contact terminals 212 are electrically connected to a corresponding number of conductive contact terminals 702 via wire paths printed on flexible connectors 204, which are bonded to wafer translator portion 202 by a guide frame 736. Pads 702 are electrically connected to contact structures 310 via wire paths 306 disposed within wafer translator portion 202. Contact terminals 212 are available to be contacted by a probe head 740. Wire paths 308 electrically connect conductive pads 312 to a corresponding number of wafer sort pads 210, disposed on the uppermost surface of translator 202, in vertical alignment (i.e., superjacent) with the wafer. Contact terminals 210 are available to be contacted by prober head 738. In various alternative embodiments, wire paths may be printed on, or otherwise disposed within, flexible connectors 204. In still further embodiments, flexible connectors 204 may be otherwise formed using coaxial cable, ribbonized coaxial cable, twisted pair cable or other flexible conductive material disposed so as to form an electrical connection between contact structures 310 and contact terminals 212. In these and further embodiments, connectors 204 may be draped (as in FIGS. 1 and 5), rolled or otherwise arranged or constituted to accommodate a range of motion on the part of wafer chuck 734, allowing prober head 738 to serially contact translated die 718, 720, on wafer 714 while maintaining an electrical connection between contact structures 310 and contact terminals 212.

FIG. 8 is a schematic cross-sectional representation of bimodal full wafer test assembly 700 in operation. Wafer 714 and wafer translator portion 202, mounted on wafer chuck 734, may move laterally in relation to stationary prober head 738 and stationary mounting fixture 728, so as to make die 718 or 720, or other die on wafer 714, available to be contacted by prober head 738. Flexible connectors 204 maintain electrical contact between conductive pads 310 and contact terminals 212, allowing prober 740 to contact die on wafer 714 contemporaneously with, and independently of, the operation of prober head 738.

In some embodiments of the present invention a wafer translator and the flexible conductors extending therefrom are formed from a unitary body. In other embodiments, the flexible conductors extending from the wafer translator are separately formed and attached to the wafer translator.

CONCLUSION

The exemplary methods and apparatus illustrated and described herein find application in the field of integrated circuit test and analysis.

It is to be understood that the present invention is not limited to the embodiments described above, but encompasses any and all embodiments within the scope of the subjoined Claims and their equivalents.

What is claimed is:

1. A flexible extension wafer translator, comprising:
   a wafer translator portion, the wafer translator portion comprising
      a body having a first surface and a second surface;
      a first plurality of contact terminals disposed on the first surface;
      a second plurality of contact terminals disposed on the second surface, the second plurality of contact terminals arranged in a pattern to match the layout of a plurality of pads across a plurality of integrated circuits on a wafer to be contacted, and operable to simultaneously provide electrical connection to each of the plurality of pads on the integrated circuits;
      a first plurality of electrically conductive pathways disposed in the body such that a first portion of the second plurality of contact terminals is electrically connected to corresponding ones of the first plurality of contact terminals on the first surface;
   at least one flexible connector extending outwardly from the wafer translator portion; and
   a connector tab attached to a distal end of each flexible connector, the connector tab having a third plurality of contact terminals;
   wherein the wafer translator portion is removably attachable to the wafer.

2. The flexible extension wafer translator of claim 1, wherein the at least one flexible connector is draped between the wafer translator portion and the connector tab.

3. The flexible extension wafer translator of claim 1, wherein the at least one flexible connector is pleated between the wafer translator portion and the connector tab.

4. The flexible extension wafer translator of claim 1, wherein the connector tab includes alignment holes.

5. The flexible extension wafer translator of claim 1, further comprising a second plurality of electrically conductive pathways disposed in the body such that a second portion of the second plurality of contact terminals is electrically connected to corresponding ones of the third plurality of contact terminals on the connector tabs.

6. The flexible extension wafer translator of claim 1, wherein each of the first plurality of contact terminals is larger in area than each of the second plurality of contact terminals.

7. The flexible extension wafer translator of claim 1, wherein each of the third plurality of contact terminals is larger in area than each of the second plurality of contact terminals.

8. The flexible extension wafer translator of claim 1, wherein the wafer translator includes an evacuation pathway.

9. The flexible extension wafer translator of claim 1, wherein the at least one flexible connector comprises at least one coaxial cable.

10. The flexible extension wafer translator of claim 1, wherein the at least one flexible connector comprises at least one twisted pair cable.

11. The flexible extension wafer translator of claim 1, wherein the flexible connector is bonded to the wafer translator portion by a guide frame.

12. The flexible extension wafer translator of claim 1, wherein the flexible connector is bonded to the wafer translator portion by a guide frame disposed on the first surface of the wafer translator portion.

* * * * *